US011499999B2

(12) United States Patent
Lange et al.

(10) Patent No.: US 11,499,999 B2
(45) Date of Patent: Nov. 15, 2022

(54) ELECTRICAL METER SYSTEM FOR ENERGY DESEGREGATION

(71) Applicant: Carnegie Mellon University, Pittsburgh, PA (US)

(72) Inventors: Henning Lange, Pittsburgh, PA (US); Jeremy Zico Kolter, Pittsburgh, PA (US); Mario Berges, Pittsburgh, PA (US)

(73) Assignee: Carnegie Mellon University, Pittsburgh, PA (US)

( * ) Notice: Subject to any disclaimer, the term of this patent is extended or adjusted under 35 U.S.C. 154(b) by 86 days.

(21) Appl. No.: 15/976,774

(22) Filed: May 10, 2018

(65) Prior Publication Data

US 2018/0328967 A1    Nov. 15, 2018

Related U.S. Application Data

(60) Provisional application No. 62/602,886, filed on May 10, 2017.

(51) Int. Cl.
| | | |
|---|---|---|
| *G01R 21/133* | (2006.01) | |
| *G01R 31/28* | (2006.01) | |
| *G06N 3/08* | (2006.01) | |
| *G01D 4/00* | (2006.01) | |
| *G01R 22/10* | (2006.01) | |
| *G06N 7/00* | (2006.01) | |
| *G06N 3/04* | (2006.01) | |

(52) U.S. Cl.
CPC ........... *G01R 21/133* (2013.01); *G01D 4/004* (2013.01); *G01R 22/10* (2013.01);
(Continued)

(58) Field of Classification Search
CPC .. G01R 21/133; G01R 22/10; G01R 31/2825; G06N 3/084; G06N 3/088; G06N 3/0445;
(Continued)

(56) References Cited

U.S. PATENT DOCUMENTS

2012/0290230 A1* 11/2012 Berges Gonzalez .......................
G05B 19/0428
702/61

OTHER PUBLICATIONS

Gao et al., A Feasibility Study of Automated Plug-Load Identification from High-Frequency Measurements, Dec. 14-16, 2015, 2015 IEEE Global Conference on Signal and Information Processing (GlobalSIP), pp. 220-224 (Year: 2015).*

(Continued)

*Primary Examiner* — Toan M Le
(74) *Attorney, Agent, or Firm* — Fish & Richardson P.C.

(57) ABSTRACT

An energy meter is configured to determine component waveforms that form a measured waveform. The meter inputs the waveform into one or more entries of a data structure, each entry of the one or more entries of the data structure storing a weight value that is determined based at least in part on values of the data signatures representing the plurality of remote devices, each entry being connected to one or more other entries of the data structure. The meter, for each of the one or more entries, generates an output value by performing an arithmetic operation on the waveform stored at that entry, the arithmetic operation comprising a function of the weight value. The meter identifies, from among the data signatures, one or more particular data signatures that are represented in the waveform. The meter determines, based on the particular data signatures, an operational state of another device.

19 Claims, 8 Drawing Sheets

(52) U.S. Cl.
CPC ....... *G01R 31/2825* (2013.01); *G06N 3/0445* (2013.01); *G06N 3/084* (2013.01); *G06N 3/088* (2013.01); *G06N 7/005* (2013.01)

(58) Field of Classification Search
CPC .... G06N 7/005; G01D 4/004; G01D 2204/24; Y02B 90/20; Y04S 20/30
See application file for complete search history.

(56) References Cited

OTHER PUBLICATIONS

Biansoongnern et al., Nonintrusive Load Monitoring (NILM) Using an Artificial Neural Network in Embedded System with Low Sampling Rate, 2016 IEEE, 4 pp. (Year: 2016).*

Chang et al., Particle-Swarm-Optimization-Based Nonintrusive Demand Monitoring and Load Identification in Smart Meters, Sep./Oct. 2013, IEEE Transactions on Industry Applications, vol. 49, No. 5, pp. 2229-2236 (Year: 2013).*

IEEE Xplore Search Results, Jun. 22, 2021, 1 pp. (Year: 2021).*

Ghosh et al., The Classification of Power System Disturbance Waveforms Using a Neural Network Approach, Jan. 1995, IEEE Transactions on Power Delivery, vol. 10, No. 1, pp. 109-115 (Year: 1995).*

H. Lange and M. Berges, "Bolt: Energy disaggregation by online binary matrix factorization of current waveforms," Proceeding of the 3$^{rd}$ ACM International Conference on Systems for Energy-Efficient Built Environments, pp. 11-20 (2016).

* cited by examiner

ELECTRICAL METER SYSTEM FOR ENERGY DESEGREGATION

CLAIM OF PRIORITY

This application claims priority under 35 U.S.C. § 119(e) to U.S. Patent Application Ser. No. 62/602,886, filed on May 10, 2017, the entire contents of which are hereby incorporated by reference.

TECHNICAL FIELD

This application relates to energy meters and energy meter systems.

BACKGROUND

In electrical systems today, many electrical devices can be connected to a common power source. A meter at or near the common power source can read power signals and determine how much power is being used. However, it can be difficult to determine which electrical devices are drawing power, how much power they are drawing, and how they are drawing power from the common source.

SUMMARY

The energy meter system described herein is capable of determining, from a power signal measured by the meter, the identity and the operational state of one or more devices that are connected to the power signal (such as in an electrical system in a room, building, etc.). The energy meter system can decompose (e.g., reduce into component parts) a power signal (e.g., a current signal, voltage signal, instantaneous power signal, etc.). The component parts of the power signal can each represent a remote device or a portion of a remote device. This is also called "energy disaggregation," or disaggregation of the electrical or power signal. The methods, models, and systems for energy disaggregation are described in detail below.

The objective of energy disaggregation or non-intrusive load monitoring (NILM) is to infer appliance-level power consumption information given only a single measurement at the main distribution. The observed aggregate power (or current) measured at the main distribution constitutes the sum of the power (or current) of the individual appliances. Since, appliance states evolve (to some degree) independently and the aggregate observation is dependent on the joint state of all appliances, Factorial Hidden Markov Models (FHMMs) have emerged as a prominent model of the generative process of the aggregate observation. However, because appliance states become conditionally dependent given the aggregate observation, exact inference of the posterior, i.e. the distribution of appliance states given the aggregate observation, was previously intractable.

FHMMs are a generalization of Hidden Markov Models in which multiple hidden states evolve independently in parallel. See network 406 of FIG. 4 for a representation of the associated graphical model. When the parameters of the individual HMM chains are known, energy disaggregation can be posed as the decoding problem for FHMMs. However, obtaining these parameters is usually prohibitively computationally expensive. The methods described below enable these parameters to be obtained by the energy meter system. FHMMs, and how they are applied to energy disaggregation, are described in detail below.

The energy meter system described herein is based on a model that makes use of a very tractable auxiliary distribution that approximates the true forward probabilities. This tractable auxiliary distribution is parameterized by a deep neural network. The neural networks in conjunction with Variational Bayes can be used as a powerful tool for statistical inference. Variational Bayes is a framework that allows statistical inference to be posed as an optimization problem. In addition, neural networks have become a dominant approach for non-linear optimization.

In order to explain the power consumption of an appliance, the algorithm uses multiple components and performs re-aggregation of the inferred components into components of the input waveform that each represent remote devices, such as appliances. The energy meter system enables use of high frequency information of the input waveform. The high frequency information can be leveraged by posing energy disaggregation as a binary matrix factorization problem. The energy meter system not only exploits temporal information at a sub-cycle level, it also leverages macro-level temporal information to help overcome re-aggregation needs. It is extended to incorporate the temporal patterns of the component activities ultimately leading to temporal decorrelation of inferred components thus alleviating the problem of stitching, as explained below.

The model of the energy meter system uses the high frequency information of patterns that appliances jointly generate in aggregation. Usually, an appliance is turned on, operated for some time and then turned off again. Furthermore, a spike in the power consumption can usually be explained by a single appliance changing states. This switching behavior can be modeled gracefully in graphical models, e.g. Factorial HMM. While inference in FHMM is usually intractable, the energy meter system combines the structured representation of graphical models with efficient optimization techniques from neural networks combined with simplifying assumptions on the latent variables, to ultimately perform coordinate ascent on the joint likelihood in order to perform end-to-end unsupervised energy disaggregation. As such, the FHMM model of the energy meter system reduces a computational complexity of determining the operating state of one or more remote devices (e.g., appliances), relative to systems that do not include the neural network FHMM model of the energy meter system.

The energy meter includes one or more sensors configured to measure an electrical signal; one or more hardware storage devices configured to store data signatures representing a plurality of remote devices, where each data signature represents at least a portion of a remote device of the plurality of remote devices; and an executable logic engine configured to perform operations including: receiving, from the one or more sensors, a plurality of measurements of the electrical signal; generating, from the plurality of measurements, a waveform representing the electrical signal; determining one or more component waveforms that form the waveform by: inputting the waveform into one or more entries of a data structure, each entry of the one or more entries of the data structure storing a weight value that is determined based at least in part on values of the data signatures representing the plurality of remote devices, each entry being connected to one or more other entries of the data structure; for each of the one or more entries, generating an output value by performing an arithmetic operation on the waveform stored at that entry, the arithmetic operation including a function of the weight value; identifying from among the data signatures, based on the output values for each of the one or more entries, one or more particular data signatures that are represented in the waveform; and determining, based on the particular data signatures, an operational state of one or more remote devices of the plurality of remote devices.

In some implementations, determining the operational state of one or more remote devices of the plurality of remote devices comprises a determination that a remote device of the plurality of the remote devices is malfunctioning. In some implementations, the weight value of an entry of the data structure is determined based on an unsupervised machine learning process.

In some implementations, the executable logic engine is further configured to adjust a weight value of one or more data entries based on receiving data representing additional remote devices, and where determining the one or more component waveforms that form the waveform is based on the adjusted weight value of the one or more data entries. In some implementations, the executable logic engine is further configured to adjust a weight value of one or more data entries based on additional data representing one or more of a time of day, a temperature, a number of remote devices contributing to the electrical signal, building automation system signals, input from a user, and a constraint value of the waveform. In some implementations, the executable logic engine comprises a neural network.

In some implementations, the waveform is generated based on measurements received during an integer number of periods of an alternating-current (AC) cycle. In some implementations, a remote device of the plurality of remote devices comprises one of an appliance or a portion of an appliance.

In some implementations, the plurality of measurements comprises a current measurement. In some implementations, the plurality of measurements comprises a voltage measurement. In some implementations, the plurality of measurements comprises a measurement of instantaneous power.

In some implementations, the meter includes a controller configured to control operation of one or more remote devices of the plurality of remote devices in response to determining the operational state of the one or more remote devices. In some implementations, the meter includes a controller configured to: send data indicating the operational state of the one or more remote devices to a client device; receive an input from the client device; and control operation of the one or more remote devices in response to receiving the input from the client device.

In some implementations, the data structure is configured to reduce a computation time of determining the one or more component waveforms by reducing a number of calculations to determine the one or more component waveforms relative to determining the one or more component waveforms without the data structure.

In some implementations, an energy meter system includes a server configured to store a library of data signatures, where each data signature of the library of data signatures represents at least a portion of a remote device of a plurality of remote devices; and one or more meters in communication with the server, each meter including: one or more sensors configured to measure an electrical signal; one or more processors configured to determine an operational state of the remote device by performing operations including: receiving, from the one or more sensors, a plurality of measurements of the electrical signal; generating, from the plurality of measurements, a waveform representing the electrical signal; determining one or more component waveforms that form the waveform by: inputting the waveform into one or more entries of a data structure, each entry of the one or more entries of the data structure storing a weight value that is determined based at least in part on values of the data signatures representing the plurality of remote devices, each entry being connected to one or more other entries of the data structure; for each of the one or more entries, generating an output value by performing an arithmetic operation on the waveform stored at that entry, the arithmetic operation including a function of the weight value; identifying from among the data signatures, based on the output values for each of the one or more entries, one or more particular data signatures that are represented in the waveform; and determining, based on the particular data signatures, an operational state of one or more remote devices of the plurality of remote devices.

In some implementations, the server is further configured to: store calibration data; send the calibration data to a meter; and cause the meter to adjust one or more weight values of the data structure based on the calibration data. In some implementations, the server is further configured to send the calibration data to the meter in response to receiving a signal from the meter indicating a failure of the one or more processors to determine the operational state of the one or more remote devices of the plurality of remote devices. In some implementations, the server is further configured cause a meter to update a library of data signatures stored by the meter, where the update is caused by the server in response to receiving a signal from the meter indicating a failure of the one or more processors to determine the operational state of the one or more remote devices of the plurality of remote devices.

In some implementations, a non-transitory computer readable medium is configured perform one or more operations including receiving data signatures representing a plurality of remote devices, where each data signature represents at least a portion of a remote device of the plurality of remote devices; receiving a plurality of measurements of an electrical signal; generating, from the plurality of measurements, a waveform representing the electrical signal; determining one or more component waveforms that form the waveform by: inputting the waveform into one or more entries of a data structure, each entry of the one or more entries of the data structure storing a weight value that is determined based at least in part on values of the data signatures representing the plurality of remote devices, each entry being connected to one or more other entries of the data structure; for each of the one or more entries, generating an output value by performing an arithmetic operation on the waveform stored at that entry, the arithmetic operation including a function of the weight value; identifying from among the data signatures, based on the output values for each of the one or more entries, one or more particular data signatures that are represented in the waveform; and determining, based on the particular data signatures, an operational state of one or more of the plurality of remote devices.

In some implementations, the data structure is configured to reduce a computation time of determining the one or more component waveforms by reducing a number of calculations to determine the one or more component waveforms relative to determining the one or more component waveforms without the data structure.

The details of one or more embodiments of the energy meter system are set forth in the accompanying drawings and the description below. Other features, objects, and advantages of the energy meter system will be apparent from the description and drawings, and from the claims.

DESCRIPTION OF DRAWINGS

Like reference symbols in the various drawings indicate like elements.

DETAILED DESCRIPTION

Figure 1:
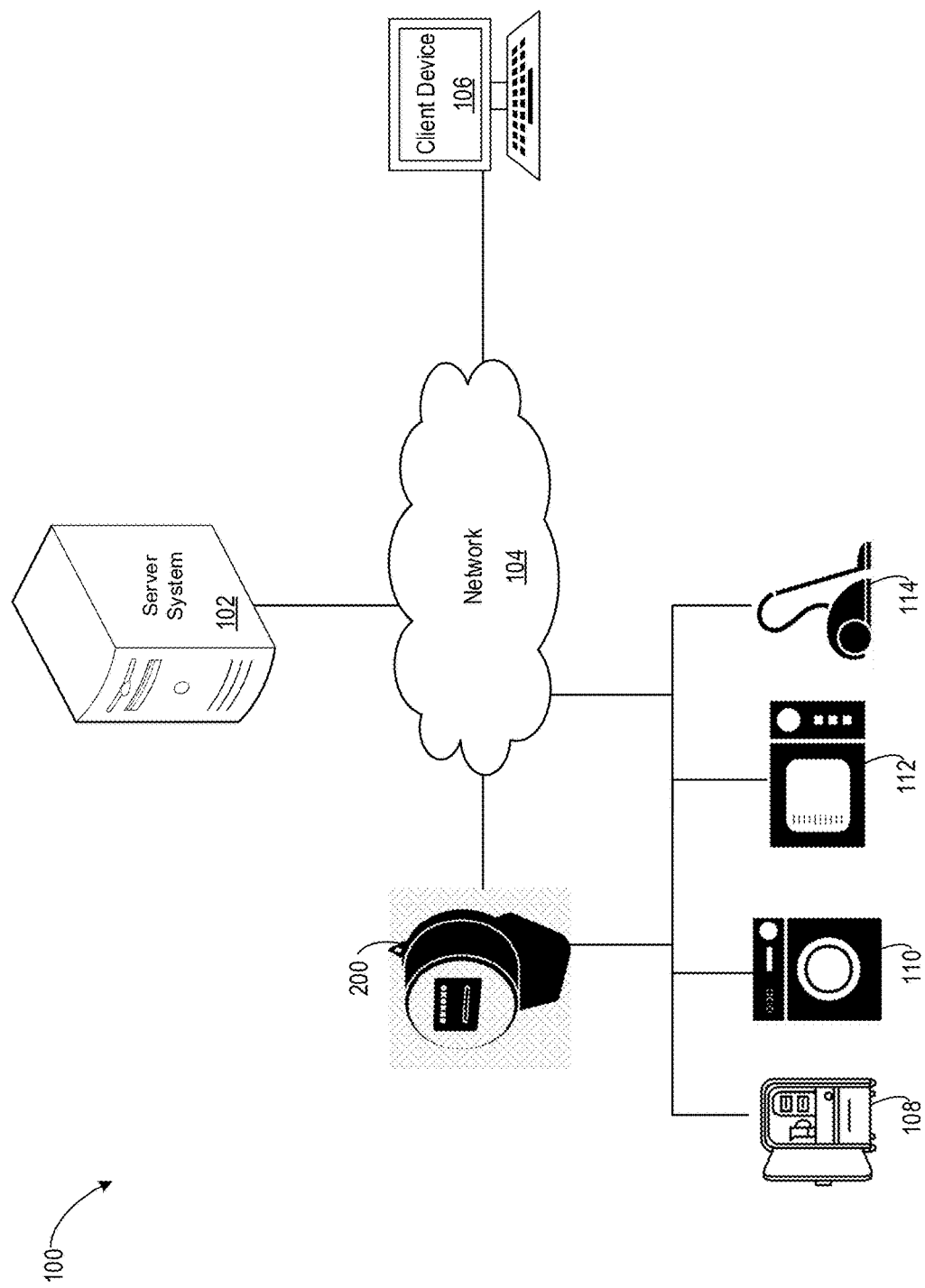
FIG. 1 shows an example energy meter system configured for energy desegregation.

FIG. 1 shows an example energy meter system 100 configured for energy desegregation. The energy meter system 100 includes a server system 102, a meter 200, a client device 106, and one or more remote devices 108, 110, 112, and 114. The meter 200 is configured to communicate with the server system 102 and/or the client device 106 over a network 104. Network 104 can include any form of wired or wireless network, and can be a local area network (LAN) or wide area network (WAN). In some implementations, more than one meter 200 (e.g., dozens, hundreds, or thousands) can be connected to the server system 102. Data from the meters 200 can be used for updating other meters or cross-training other meters.

The meter 200, server system 102, and client device 106 can work together for determining the operational state of one or more of the remote devices 108, 110, 112, 114 (the "remote devices"). A remote device can be any electrically powered, device, as explained in detail below. When each of the one or more remote device is activated, the respective remote device contributes to an aggregate waveform (not shown) that is measured by the meter 200.

The meter 200 is capable of determining, from a power signal (e.g., a current signal, voltage signal, instantaneous power signal, etc.) measured by the meter, the identity and the operational state of the remote devices that are connected to the power signal (such as in an electrical system in a room, building, etc.). The power signal at or near the meter 200 represents a power draw by each remote device connected to the power system being metered. The power draw of each remote device is additive with other remote devices. The meter 200 reads this aggregate power signal that includes the power draw of each of the individual remote devices being powered by the power signal. The energy meter system can decompose (e.g., reduce into component parts) the power signal. The component parts of the power signal can each represent a remote device or a portion of a remote device. This is also called "energy disaggregation," or disaggregation of the electrical or power signal. Thus, the meter is capable, through models described below, of disaggregating the aggregate power signal into components each representing a remote device (or a portion thereof).

Energy disaggregation can facilitate discovery of and unlock energy saving opportunities in buildings, The objective of this single-channel source separation problem, also known as non-intrusive load monitoring (NILM), is to infer appliance-level power consumption information given data from only a single sensing point at the main electrical panel of a building. The observed aggregate power measured at the main panel constitutes the sum of the power of the individual appliances. Since, appliance state (e.g., on, off) evolves independently and the aggregate observation is dependent on the joint state of all appliances, Factorial Hidden Markov Models (FHMM) are a prominent model for the generative process of the aggregate observations. However, because latent states become conditionally dependent given the observations, exact inference of the posterior, i.e. the distribution of appliance states given the aggregate observation, is intractable. Numerous approximate inference techniques have been proposed and employed in the past to tackle this problem. A "one at a time" constraint postulates that only a single appliance can change its state at any given time. This constraint allows for posterior inference by either posing the problem as an integer-programming problem or by truncating the Viterbi algorithm. This process is described further in relation to FIG. 4.

The meter 200 transmits operational state data over the network 104 to a client device 106, which can be used to control and monitor the remote devices. In some implementations, the meter 200 transmits the operational state data to the server system 102, which can be processed for other purposes, such as fault detection, energy monitoring, and so forth. In some implementations, the server system 102 stores the data received from the meter 200. In some implementations, the server system 102 stores calibration parameters (e.g., weights for a neural network or other machine learning model) of the meter 200. The server system 106 can store profiles of many different meters (including meter 200) and reprogram the meter 200 with an instance of the calibration parameters profile. For example, when the meter is installed in a building that has a known power load (e.g., a franchise restaurant, apartment unit, commercial building, or other such building), the meter can be calibrated with the profile that has been calibrated for that building. The calibration parameters can be trained using data from an instance of the building or the remote devices (e.g., appliances) within. If the meter 200 fails to identify each component of the waveform, or otherwise cannot disaggregate the waveform that is measured, the meter 200 can send a signal to the server system 102 requesting an update to the calibration parameters. In this way, the meter 200 is capable of determining when it is not properly disaggregating the waveform and can self-correct automatically. In some implementations, the meter 200 determines that one or more of the remote devices are malfunctioning, and sends an alert to the client device 106.

The remote devices include any device that is connected to the power source being monitored by the meter 200. For example, remote devices can include a refrigerator 108, a washing machine 110, a microwave 112, a vacuum 112, or any other such appliance or remote device including computers, HVAC systems, televisions, stoves, light fixtures, etc. Though four example remote devices are shown, the number of remote device can be up to dozens or hundreds. In some implementations, the remote devices are connected to the network 104, and can be configured for data communication with the server system 102 or the meter 200. For example, the remote devices include internet of things (IOT) devices.

The meter 200 can be configured to communicate over the network 104 with the one or more remote devices. In some implementations, the meter 200 includes a transceiver (not shown) and can wireless communicate with the server system 102, or directly with one or more remote devices. In some implementations, the meter 200 can be configured to control one or more of the remote devices by sending a signal to the server system 102, which in turn can control a remote device.

In some implementations, the meter 200 can be configured to control one or more of the remote devices in response to a selection of a control on the interface 300. The meter 200 can send a signal to the selected device to control operation of the device. For example the meter 200 sends a signal to turn off the remote device when the remote device is malfunctioning. In some implementations, when the meter 200 detects that a device is malfunctioning, the meter automatically causes the remote device to turn off or otherwise change its operational state.

The meter 200 uses a tractable auxiliary distribution model that approximates the expectation of forward probabilities for an energy desegregation system. The model is characterized by a deep neural network in conjunction with Variational Bayes (VB). The optimization process of the model includes posing statistical inference in the VB to maximize the variational lower bound of the data likelihood, and non-linear optimization via neural networks. The convergence of the two approaches is achieved by an Expectation Maximization algorithm.

The deep neural network is characterized as "BOLT", which stands for a Binary OnLine facTorization engine. The BOLT engine (also called the BOLT network, or simply "the BOLT") is trained to learn and identify a non-linear transformation of a single period of a phase-aligned current waveform and the subcomponent waveforms to provide non-linear mapping for the aggregate current. The BOLT performs online binary matrix factorization on a sequence of high frequency current cycles collected in a building to infer additive subcomponents of the current signal. The BOLT learning is performed in an unsupervised fashion and, in a subsequent step, seeks to find combinations of these subcomponents that constitute appliances. To explain the power consumption of an appliance, the BOLT was prone to 'stitching', i.e., the algorithm used multiple components that ultimately required re-aggregation of the inferred components into appliances for which ground truth was required.

In combination with VB and Expectation Maximization algorithm, BOLT can be evolved into a neural network engine, characterized as "VaBOLT", where VaBOLT can leverage macro-level temporal information and incorporate a prior over the temporal patterns of the component activities ultimately leading to temporal decorrelation of inferred components thus alleviating the BOLT's problem of stitching.

In some implementations, the energy meter system 100 includes monitoring energy use in a home or other building: the aggregated data can then be used to compare usage within the same building or between multiple buildings, e.g. household-to-household or business-to-business. Further, the system can compare appliances, e.g. different models of the same type of appliance or different individual appliance of the same model. Similarly, the same unit can be monitored to compare an appliance's current usage to its past performance.

Based on the data and comparisons, the system can further provide feedback to a user to share the information garnered, which can be used for general monitoring, preventative maintenance, and building-to-building communication. For example, the system could indicate that a particular appliance is currently using more energy than it has in the past, an individual appliance in one home is using more energy than the model of that appliance in a different home, or within the same business, one building uses more energy than another building.

Figure 2:
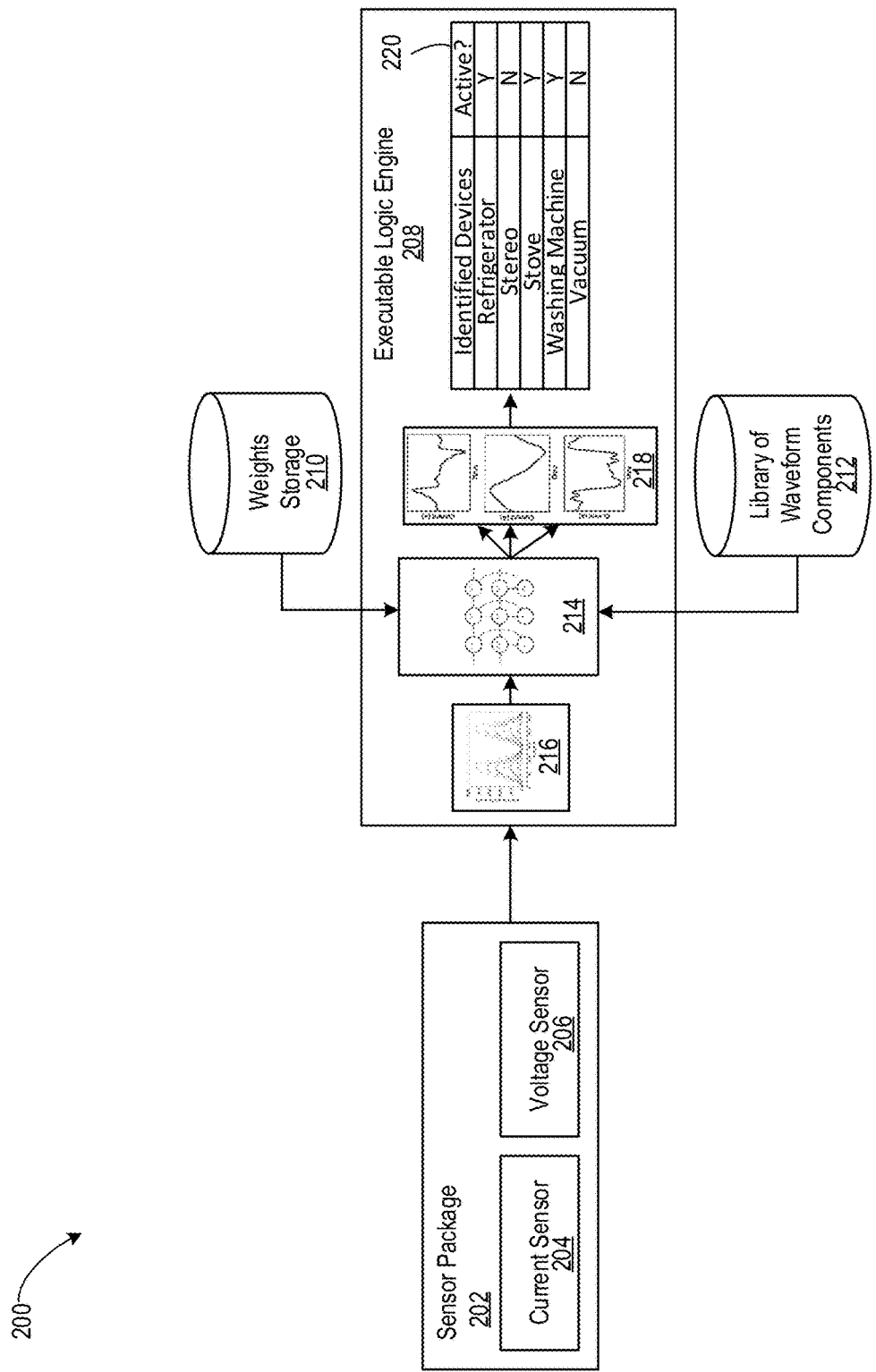
FIG. 2 shows an example of an energy meter configured for energy desegregation.

FIG. 2 shows an example of an energy meter 200 configured for energy desegregation. The meter 200 includes a sensor package 202. For example, the sensor package can include an electrical current sensor 204, a voltage sensor 206, and other sensors. In some implementations, the meter 200 includes a transmitter or other communication interface (not shown). The meter 200 receives an energy signal (e.g., an electrical signal or a power signal) from the remote devices. For example, the meter 200 includes an energy meter that is reading power usage for a building, apartment unit, or other circuit that includes a remote device.

The meter 200 includes an executable logic engine 208. The logic engine 208 is capable of running the models described below. The logic engine can receive data from one or more storage devices, such as a weights storage 210 and a library of waveform components 212. The weights storage 210 includes calibration parameters for the model that is executed by the logic engine 208, and can be used to calibrate the model as describe above. The library 212 stores known data signatures (e.g., waveform components) of remote devices. The data signatures of the library can be used to train and operate the machine learning model of the meter 200.

To determine the operational state of the remote devices, the meter 200 receives a power signal, processes the signal, and generates a table 220 of operational states. The remote device(s) provide an electrical signal to the sensor package 202 of the meter 200. The sensors provide a signal (e.g., a waveform 216) to the logic engine 208. The logic engine 208 applies a machine learning model 214 (described in detail below) to the waveform 216. The machine learning model 214 produces one or more component waveforms 218 by algorithm estimating both the waveforms for each component as well as their activation pattern. The logic engine 208 identifies the remote device associated with each of the component waveforms 218. In some implementations, data 220 is generated which associates each identified device with an instant or time averaged operational state. For example, the data 220 may show that an operation device is active or inactive. In some implementations, the data 220 may include a determination that a remote device is malfunctioning. In this case, an alert can be sent to a client device (e.g., client device 106 of FIG. 1). Though a table is shown in FIG. 2, the data 220 can be in the form of a text file of varying formats, a graph, a database formatted file, an SMS alert, or any other form for reporting the operational status of one or more identified remote devices.

Figure 3:
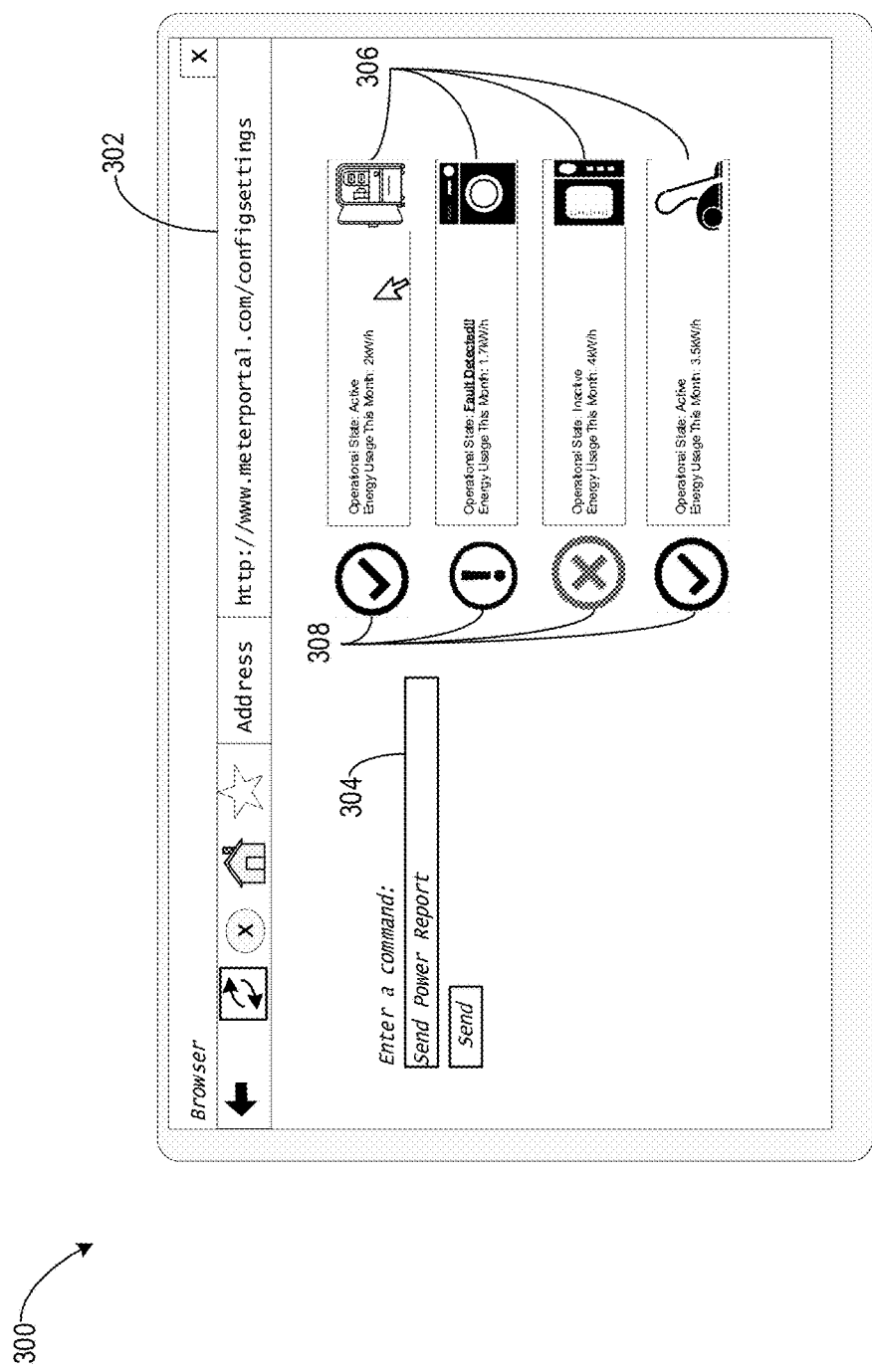
FIG. 3 shows an example user interface for a client device of an energy meter system.

FIG. 3 shows an example user interface 300 for a client device of an energy meter system. A client device (e.g., client device 106 of FIG. 1), can be interfaced with the energy meter system 100. The interface 300 can show reports to a user of the operational state of one or more remote devices connected to a meter of the system. In some implementations, the interface 300 includes a web portal 302. The interface provides one or more controls (e.g., control 304) for the user to query the operational states of the remote devices. The interface 300 includes a status 306 for one or more remote devices connected to the meter. In some implementations, the status 306 can indicate the identity of the remote device, the operational state of the remote device, the energy usage pattern of the remote device, and other such data. One or more indicators 308 may enable a user to quickly determine the operational state of a device. For example, a maintenance report can be generated from the interface 300, which may specify that a remote device is using more power than a typical instance of the device, and thus may need replacing or fixing.

The interface 300 can be configured to be shown on the client device. While a web portal 302 is shown in FIG. 3, the user interface 300 can be presented in the form of an application user interface. For example, the energy meter system 100 can send an SMS or other form of alert prompting action when a remote device is determined to be malfunctioning. In some implementations, the energy meter system 100 can automatically deactivate a malfunctioning device and send an alert though the interface 300 that corrective action has been taken, or that maintenance should be performed. In some implementations, scheduling information may be included in the interface, such that a user can determine whether one or more of the remote devices are operating according to a schedule (not shown) specified in the interface. In some implementations, energy totals for each device can be displayed in the status indicators 306, and reports that detail energy usage by each remote device can be automatically prepared for a user of the interface 300. In some implementations, the interface may automatically update to show an additional remote device when the additional remote device is detected by the meter, and as such a list of each remote device connected to the meter 200 can be maintained and presented in the interface.

In some implementations, the meter 200 can be configured to control one or more of the remote devices in response to a selection of a control on the interface 300. The meter 200 can send a signal to the selected device to control operation of the device. For example the meter 200 sends a signal to turn off the remote device when the remote device is malfunctioning. In some implementations, when the meter 200 detects that a device is malfunctioning, the meter automatically causes the remote device to turn off or otherwise change its operational state.

Figure 4:
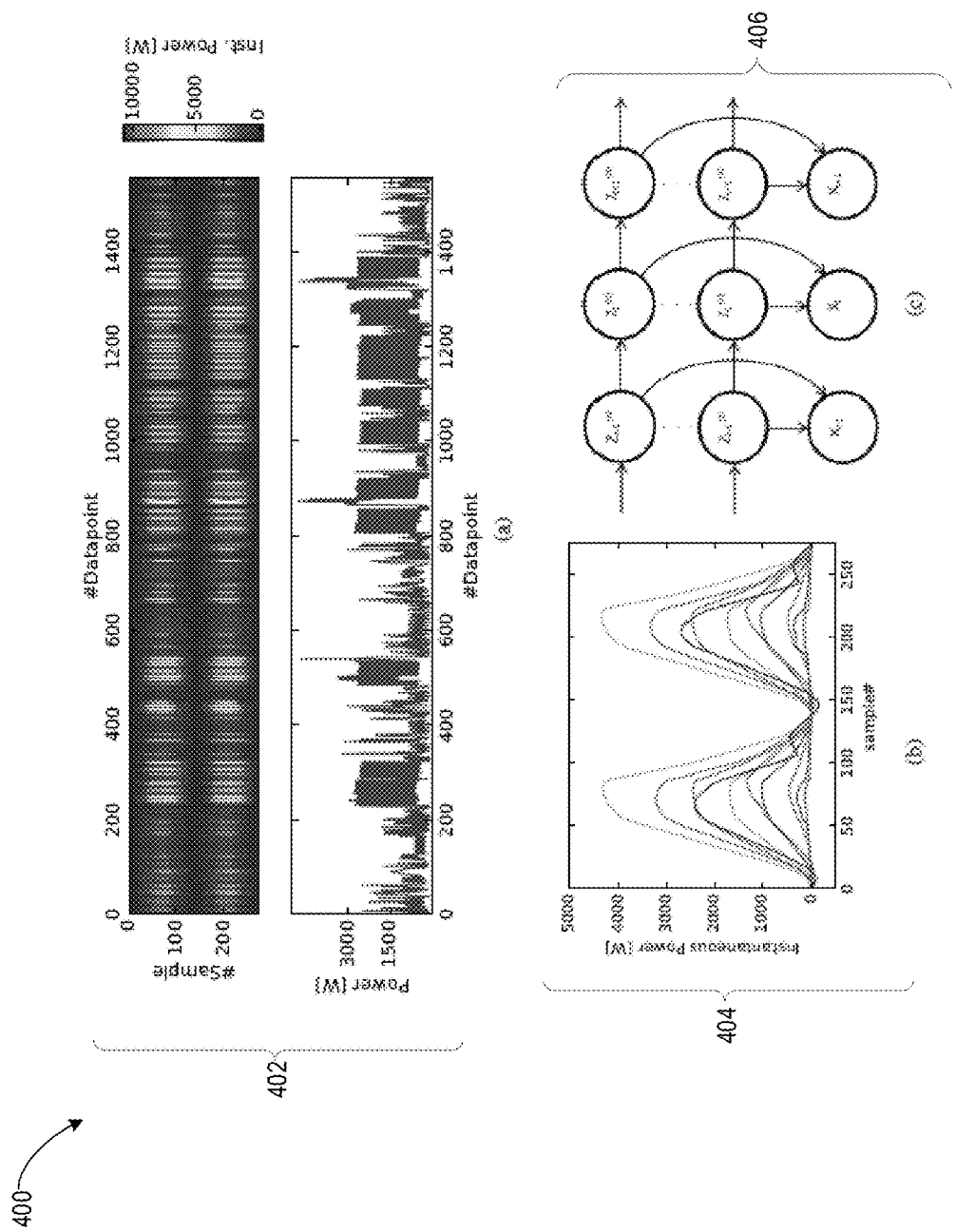
FIG. 4 shows examples of waveform data and component waveforms.

FIG. 4 shows examples 400 of waveform data and component waveforms. Data 402 includes shows aggregate instantaneous power waveforms alongside the observed aggregate active power over time. Data 404 shows examples of inferred waveform components. The network 406 includes a factor network, and is described in detail below.

The learning problem for Factorial Hidden Markov Models with discrete and multi-variate latent variables remains a challenge. Inference of the latent variables required for the E-step of Expectation Minimization algorithms is usually computationally intractable. A variational learning approach is used that mimics the Baum-Welch algorithm. By approximating the filtering distribution with a variational distribution parameterized by a recurrent neural network, the computational complexity of the learning problem as a function of the number of hidden states can be reduced to quasilinear instead of quadratic time as required by traditional algorithms such as Baum-Welch whilst making minimal independence assumptions.

The VarBOLT model introduced of the energy meter system uses a highly tractable auxiliary distribution that approximates the true filtering distribution. This tractable distribution is parameterized by a deep recurrent neural network, specifically stacked LSTMs. This combination is favorable because Variational Inference allows one to pose statistical inference as a (non-linear) optimization problem and neural networks have become a dominant approach for non-linear optimization.

Because the latent variables are binary (i.e. a Bernoulli auxiliary distribution), there are non-conjugate discrete distributions, which pose significant challenges in the context of neural networks and variational inference. This problem is circumvented by directly approximating the expectation of the true filtering distribution and introducing a loss function that directly penalizes the neural network outputs for deviating from that approximation. By making use of a tractable auxiliary distribution and making minimal independence assumptions (i.e. only posterior independence of the latent variables at a single time point) computations required for the filtering distribution that are typically quadratic in the number of hidden states can be reduced to quasilinear time. This ultimately allows modeling rich temporal dependencies between latent variables whilst keeping computational costs low.

The decreased computational costs for inference afford our solution with the additional advantage of addressing security and privacy concerns associated with energy disaggregation solutions. Disaggregation can thus be carried out in real-time on embedded hardware located within the premises.

Factorial Hidden Markov Models and Variational Inference

FHMMs are a generalization of Hidden Markov Models in which multiple hidden states evolve independently in parallel. See network 406 of FIG. 4 for a representation of the associated graphical model. When the parameters of the individual HMM chains are known, energy disaggregation can be posed as the decoding problem for FHMMs. However, obtaining these parameters is usually prohibitively computationally expensive. The methods described below enable these parameters to be obtained by the energy meter system.

Unsupervised energy disaggregation can be posed as the learning problem on the graphical model shown in FIG. 4. Because of its factorial nature, the probability of the observation at time t, $x_t$, is a function of the joint hidden state $z_t$, with $t \in \{1, \ldots T\}$. In general, the latent variables of FHMMs are modeled as categorical variables, which could lead to computationally tractable solutions. The energy meter system restricts $z_t$ to be binary, specifically Bernoulli distributed. Assuming binary hidden states removes some of the ambiguity inherent to the learning problem: every latent representation with categorical variables can be decomposed into a representation with binary variables, i.e. by assigning a binary variable for each categorical state. This binary decomposition is unique and in a sense maximal. However, binary decompositions can be aggregated into exponentially-many categorical decompositions, i.e. any combination of binary latent variables can be joined into one categorical variable. In order to avoid this ambiguity the latent variables are restricted by the energy meter system to be binary.

Since hidden states are binary and multiple hidden states evolve in parallel, $z_t \in Z = \{0, 1\}$ with C being the number of parallel hidden chains. Thus, the joint likelihood can be expressed as:

$$p(x_{1:T}, z_{1:T}) = \prod_t^T p(x_t \mid z_t) \prod_i^C p(z_{t,i} \mid z_{t-1,i}) p(z_{0,i}) \quad (1)$$

For the application of energy disaggregation, the observation $x_t$ constitutes the aggregate instantaneous power waveform aligned by zero-crossings detected in the voltage line, thus $x_t \in R^N$ with N being the number of samples per voltage cycle. Data 402 of FIG. 4 shows aggregate instantaneous power waveforms alongside the observed aggregate active power over time. Since instantaneous power is additive, $p(x_t \mid z_t)$ is modeled as a Gaussian distribution with $p(x_t \mid z_t) = N(x_t \mid W z_t, \alpha I)$ where $\alpha$ is a variance parameter, $W \in R^{N \times C}$ is a matrix containing the power waveforms of the inferred components and is not assumed to be known. Data 404 includes an example of inferred power waveforms.

Baum-Welch, an Expectation-Maximization algorithm, is a prominent algorithm for the learning problem in Hidden Markov Models. Baum-Welch makes model updates based on the expected time spent in states, the expected number of state transitions and the expected number of times a state emits an observation. An efficient algorithm to compute these quantities is the forward-backward algorithm. The forward-probabilities (2) can be computed recursively. Given the forward probabilities, the filtering distribution can be computed according to (3).

$$p(x_{1:t}, z_t) = p(x_t | z_t) \sum_{z' \in Z} p(z_t | z') p(z_{t-1}, x_{1:t-1}) \quad (2)$$

$$p(z_t | x_{1:t}) = \frac{p(x_{1:t}, z_t)}{\sum_{z' \in Z} p(x_{1:t}, z')} \quad (3)$$

Because the number of possible latent states z grows exponentially with the number of components, evaluating (2) is intractable for FHMMs. However, ideas from Variational Inference can be used to approximate forward-probabilities.

Variational Inference is a tool to deal with intractable posterior distributions and relies on an auxiliary or variational distribution Q governed by the variational parameter $\Theta$. Posterior inference in Q is required to be tractable, which is usually achieved by making independence assumptions. To paraphrase the main idea behind Variational Inference: in order to perform inference on a distribution P with intractable posterior, variational parameters $\Theta$ are chosen in such a way that Q best approximates P and then inference is performed on Q instead of P. For our application, P is the filtering distribution, i.e. (3), and Q is chosen to be an independent multivariate Bernoulli distribution with density being:

$$q_\sigma(z_t) = \Pi_i^C \sigma_i^{z_{t,i}} (1-\sigma_i)^{1-z_{t,i}}$$

and with $\sigma_i$ being the coin flip probabilities of the latent variables. For the conditional $q_\sigma(z_t|x_t)$, the coin flip probabilities are functions of the conditioning variable $x_t$, i.e.

$$q_\sigma(z_t = \vec{1} | x_t) = \sigma_t = f_\Theta(x_t)$$

Because Q should capture the temporal dependencies present in P, f is chosen to include a recurrent deep neural network governed by the variational parameters $\Theta$ (which in this case constitute the weights of the neural network). This in turn means that $\sigma_t = f_\Theta(x_{1:t})$ is a function of all previous observations $x_{1:t}$, i.e. Q is also a filtering distribution: $q(z_t|x_{1:t})$. Note that this implies that the auxiliary distribution does not assume independence between elements of the latent variable at any given time.

The evidence lower bound (ELBO) as a variational objective can be derived as follows:

$$\mathcal{L} = \log p(x_{1:t}) - D_{KL}(q(z_t|x_{1:t}) \| p(z_t|x_{1:t})) \quad (4)$$

$$= \mathbb{E}_Q [\log p(x_{1:t}, z_t)] - \mathbb{E}_Q [\log q(z_t)] \quad (5)$$

Because of the equivalence of (4) and (5), maximizing (5) is equivalent to maximizing (4). This means that optimizing the parameters of P and Q with respect to (5) leads to maximization of the log-likelihood of the data as well as minimization of the posterior divergence. Although the second expectation of (5) usually has an analytical solution, evaluating the first expectation is usually achieved by sampling from Q. However, approximating the expression by sampling disconnects the optimization problem from the variational parameters $\Theta$, i.e. Q vanishes from the optimization problem. For some continuous non-conjugate distributions, this problem can be avoided by the re-parameterization trick, i.e. by finding a deterministic and differentiable function that provides samples of Q given the variational parameters $\Theta$ and some random noise. For binary non-conjugate distributions such as the Bernoulli such a function does not seem to exist. The true filtering distribution is approximated, i.e. estimated $p(z_t|x_{1:t})$ with the help of Q.

Given estimates $\hat{p}(z_t|x_{1:t})$, the $\sigma^*$ as a function of $\Theta$ resulting in the lowest forward KL-divergence can be obtained, i.e.

$$\sigma^* = \arg\min_\sigma \Sigma_t D_{KL}(\hat{p}(z_t|x_{1:t}) \| q_\sigma(z_t|x_{1:t}))$$

Given $\sigma^*$, the binary cross-entropy loss between $\sigma$ and $\sigma^*(H(\sigma_t, \sigma^*))$ is then minimized in order to minimize the forward KL-divergence.

Minimizing the binary cross-entropy loss between $\sigma$ and $\sigma^*$ minimizes the posterior divergence but since the parameters of P (the component waveforms W) are not known, the model needs to be forced to explain the aggregate signal explicitly. Otherwise, the free parameter W will be abused to minimize the divergence without explaining the data. Thus, $\mathbb{E}_Q[\hat{p}(z_t, x_{1:t})]$ is maximized in order to explain the aggregate waveforms. Hence, the objective function becomes:

$$L(\sigma, W) = \sum_t \mathbb{E}_Q[\hat{p}(z_t, x_{1:t})] - H(\sigma_t, \sigma_t^*)$$

$$\text{with: } \sigma_t^* = \min_\sigma D_{KL}(\hat{p}(z_t | x_{1:t}) \| q(z_t | x_{1:t}))$$

$$= \mathbb{E}_{\hat{p}(z_t|x_{1:t})}[z]$$

$$\text{and: } -H(\sigma_t, \sigma_t^*) = \sigma_t^* \log(\sigma_t) + (1 - \sigma_t^*) \log(1 - \sigma_t)$$

In summary, computing the filtering recursion required for the E-step of Baum-Welch is prohibitively expensive since it requires a summation over exponentially many latent configurations. An auxiliary distribution $q(z_t|x_{1:t})$ that assumes independence between elements in $z_t$ is introduced, which allows for approximating $\hat{p}(z_t|x_{1:t})$. Note that q does not assume independence over time steps. The independence structure of the auxiliary distribution is then exploited to approximate the filtering recursion efficiently circumventing summation of exponentially-many latent configurations. In order to optimize the parameters of the auxiliary distribution, the variational parameters minimizing the KL-divergence between P and Q, i.e. $\sigma^*$, are estimated and the binary cross-entropy loss between the predicted parameters $\sigma$ and the optimal $\sigma^*$ is minimized. This is equivalent to minimizing the KL-divergence but circumvents the re-parameterization trick and allows for a compact representation of the problem.

Note that $\sigma$ and $\Theta$ are interchangeably called variational parameters, but in reality, $\sigma$ is a function of the true variational parameters, i.e. the neural network weights $\Theta$, and when a loss is defined with respect to $\sigma$ gradients with respect to $\Theta$ can be obtained by application of the chain rule, i.e. back-propagation.

Estimating Filter Distribution Probabilities

When using the forward-algorithm to obtain the filtering distribution $p(z_t|x_{1:t})$ for FHMMs, the computational complexity is in $O(2^{2C} T')$, with C being the number of components and $T'$ being the number of discrete time steps. A learning algorithm that operates in $O(C^{\epsilon+1}T)$ with $C^\epsilon$ being the number of candidate latent state configurations is used and $T \ll T'$ (by reducing decision variables) and $\epsilon \ll C$ (by enforcing sparsity.

Reducing Decision Variables

For the problem of energy disaggregation, the aggregate observation is highly non-iid, i.e. instantaneous power waveforms tend to repeat themselves over time since they are associated with the operational state of appliances (and these do not change very often). This implies that, as long as the aggregate observations have not changed significantly, the latent states will not have changed and no new decision needs to be made. Thus, by employing a simple change-point detector that extracts points in time, so called events, where a significant change in the aggregate power was observed, the number of decision variables can be reduced significantly. Let the number of detected events be T. Reducing the number of decision variables reduces the complexity to $O(2^{2C} T)$. Depending on the change point detector, T is of three orders of magnitude smaller than P.

Enforcing Sparsity

A portion of the latent space can be excluded by enforcing sparsity of the latent variables. Usually only a small number of appliances are active at any given time. Thus, latent configurations where more than E components are active can be excluded. Let $$\mathcal{Z} = \{z \in \{0, 1\}^C \mid \Sigma_i z_i < \epsilon\}$$

be the set of sparse candidate latent configurations. It assumed that $$p(x_{1:t}, z_t = z_i) = 0 \text{ for all } z_i \notin \mathcal{Z}$$

This assumption enables evaluation of $p(z_t|x_{1:t})$, since the denominator of equation (3) has become tractable. This assumption reduces the computational complexity to $O(C^{2\epsilon}T)$ with $|\mathcal{Z}| \in \mathcal{O}(C^{l\epsilon})$.

Variational Approximation of $p(z_t|x_{1:t})$

For many problems modeled with FHMMs, such as energy disaggregation, $p(z_t|x_t)$ and therefore $p(z_t|x_{1:t})$ are highly multi-modal distributions. However, since the auxiliary conditional distribution Q assumes independence between elements of z, Q is unable to learn the multi-modality of $p(z|x)$. However, Q is able to either learn $\arg\max_z p(z|x)$ or $\mathbb{E}_{Q_{p(z|x)}}[z]$.

These two modeling choices are reflected in either minimizing the forward $D_{KL}(P\|Q)$ or reverse $D_{KL}(Q\|P)$, respectively. It can be shown that:

$$\arg\min_\sigma D_{KL}(P\|Q_\sigma) = \mathbb{E}_{p(z|x)}[z]$$

$$\arg\min_\sigma D_{KL}(Q_\sigma\|P) = \arg\max_z p(z|x)$$

Viterbi learning was proposed as a faster alternative to Baum-Welch. For Viterbi learning the model parameters are updated based on the most probable path $$z_{1:T}^* = \arg\max_{z_{1:T}} p(z_{1:T}|x_{1:T}).$$

Since minimizing the reverse KL-divergence forces Q to learn the most probable mode of P, minimizing the reverse KL-divergence approximates Viterbi learning but tends to underfit considerably. On the other hand, minimizing the forward KL-divergence seems to preserve more information about state posterior probabilities. However, this model does not correspond fully to learning like Baum-Welch, i.e. updating the model based on $p(z_t|x_{1:T})$, but rather updating based on $p(z_t|x_{1:t})$, that is, making model updates based on forward-probabilities alone whilst ignoring backward-probabilities.

As discussed earlier, the Baum-Welch algorithm as well as Viterbi learning require computations that are quadratic in the numbers of hidden states. Even with the domain-specific sparsity assumptions introduced earlier, computations that are quadratic in the number of latent configurations are still prohibitively expensive. The key insight into circumventing these computations is the fact that the filtering distribution at time t, i.e. $p(z_t|x_{1:t})$ can be approximated by exploiting the independence structure of Q, i.e. the fact that the auxiliary distribution assumes independence between components at any single point in time. Starting with equation (2):

$$p(x_{1:t}, z_t) = p(x_t | z_t) \sum_{z' \in Z} p(z_t | z') p(z_{t-1} = z', x_{1:t-1})$$

$$\approx p(x_t | z_t) \sum_{z' \in Z} p(z_t | z') q(z_{t-1} = z' | x_{1:t-1}) p(x_{1:t-1})$$

$$= p(x_t | z_t) \sum_{z' \in Z} p(z_t | z') \prod_i \sigma_{t-1,i}^{z_i'} (1 - \sigma_{t-1,i})^{1-z_i'} p(x_{1:t-1})$$

Note that FHMMs components switch independently, i.e., $p(z|z') = \prod_i p(z_i|z_i')$ and let $\pi(m, n)$ be the state-transition probabilities. Because $q(z_t|x_{1:t})$ assumes independence between elements of $z_t$, the expression is simplified by recursively pulling out elements of $q(z_t|x_{1:t})$, ultimately allowing a sum over all possible z into a sum over the number of components, i.e. circumventing computations that grow exponential with the number of parallel latent states:

$$p(x_{1:t}, z_t) \approx p(x_t | z_t) p(x_{1:t-1})$$

$$\sum_{z' \in Z} \prod_i p(z_{t,i} = z_i | z_{t-1,i} = z_i') \sigma_{t-1,i}^{z_i'} (1 - \sigma_{t-1,i})^{1-z_i'}$$

$$= p(x_t | z_t) p(x_{1:t-1})$$

$$\sum_{z' \in Z} \prod_i (z_i \pi(1, z_i') + (1 - z_i) \pi(0, z_i')) \sigma_{t-1,i}^{z_i'} (1 - \sigma_{t-1,i})^{1-z_i'}$$

$$= p(x_t | z_t) p(x_{1:t-1})$$

$$\sum_i z_i \sigma_{t-1,i} \pi(1, 1) + z_i (1 - \sigma_{t-1,i}) \pi(1, 0) +$$

$$(1 - z_i) \sigma_{t-1,i} \pi(0, 1) + (1 - z_i)(1 - \sigma_{t-1,i}) \pi(0, 0)$$

$$= \hat{p}(x_{1:t}, z_t)$$

This enables approximation of the forward probabilities $p(z_t, x_{1:t})$ based on $\sigma_{t-1}$ as provided by Q and W as a parameter of P. Since $\hat{p}(z_t, x_{1:t})$ can be computed by the energy meter system for all sparse $z \in Z$, the filtering distribution $\hat{p}(z_t|x_{1:t})$ is approximated according to equation (3). Note that $p(x_{1:t-1})$ does not need to be modeled because it cancels out.

Let $\sigma^* = \mathbb{E}_{Q_{(z_t=z|z_{1:t})}}[z]$. Even though $\sigma^*$ is a function of W, $\sigma^*$ is a constant and the gradient of W does not flow into $\sigma^*$. This avoids W being exploited to minimize the posterior divergence instead of explaining the aggregate data. Note that, when allowing the gradient of W to flow into $\sigma^*$, the algorithm will infer nonsensical component waveforms, i.e. waveforms that draw significant power when the voltage is 0. Based on the same reasoning, the gradient of $\sigma$ does not flow into $\mathbb{E}_Q [\hat{p}(z_t, x_{1:t})]$.

Thus by exploiting the independence assumption of the auxiliary distribution, the computational complexity estimating the filtering distribution can be reduced to $O(C^{\epsilon+1} T)$.

Gaussian copulas are paired with variational inference to minimize an objective including the reverse KL-divergence, thus circumventing the problem of having to approximate the filtering distribution. Furthermore, although not applied to sequential data and therefore not modeling temporal dependencies between latent variables, previous work has proposed approaches for the subproblem of estimating the gradient through binary stochastic units. When temporal dependencies are removed, they arrive at a similar solution to ours. Their respective loss is derived as:

$$L_{T\&S} = \Sigma_m \overline{w}^{(m)}[\log p(x|z^{(m)}) + \log p_G(z^{(m)}|x)]$$

with $\overline{w}^{(m)}$ being normalized importance weights of configuration $z(m)$. Note that, if the sparsity constrains introduced here were to be applied, the importance weights would approximate $p(z|x)$. Also note that in that case, even though motivated differently, the gradient updates with respect to the component activation probabilities $\sigma$ are equivalent when the temporal dependencies are not modeled. This justifies the seemingly arbitrary choice of minimizing the cross-entropy loss, i.e., $H(\sigma, \sigma^*)$ (instead of e.g., $(\sigma-\sigma)^2$).

It can be shown that:

$$\frac{\partial L_{T\&S}}{\partial \sigma_i} = \frac{1}{-(1-\sigma_i)}[1-\sigma_i^*] + \frac{1}{\sigma_i}[\sigma_i^*]$$

$$= \frac{\partial (1-\sigma_i^*)\log(1-\sigma_i) + \sigma_i^*\log(\sigma_i)}{\partial \sigma_i}$$

$$= \frac{\partial H(\sigma, \sigma^*)}{\partial \sigma_i}$$

Modeling Temporal Dependencies

The main objective of modeling the temporal dependencies between latent states is temporal regularization. Specifically for the problem of energy disaggregation, this means that when a single appliance changes its state, only one and not multiple components change state. Without modeling the temporal dependencies, models tend to 'stitch', i.e. when a single appliance turns on, multiple model components switch states. Also without modeling temporal dependencies, the model 'recycles' components, e.g. appliance a might be explained by components 1 and 2, then appliance b is explained by components 2 and 3 and appliance c is explained by components 1 and 3. A linear mapping from components to appliances then becomes impossible. Furthermore, for energy disaggregation, introducing fixed state transition probabilities is problematic because of vast differences in the power consumption of appliances. When every component pays a fixed cost for switching ($\pi(0, 1)$ or $\pi(1, 0)$), appliances with a high power consumption can still afford to be explained by multiple components because the cost for underestimating the aggregate is higher than multiple switching costs. At the same time, appliances that consume little power will be ignored, since when they turn on, the associated increase in aggregate loss does not outweigh the switching cost.

The difference signal $\delta x_t = x_t - x_{t-1}$ is additionally modeled. Although technically the graphical model changes, $\pi$ can also be viewed as a function of $\delta x_t$, i.e. the switching probabilities depend on how well each component explains $\delta x_t$. Switching probabilities associated with each component are defined as turning on or off at time t. Additionally, a switching probability can be associated with no component switching.

Let, $$I(t, i) = \exp[-\beta \|W_{i:} - \delta x_t\|] \quad \text{(on-switch)}$$

$$O(t, i) = \exp[-\beta \|W_{i:} + \delta x_t\|] \quad \text{(off-switch)}$$

$$X(t) = \exp[-\beta \|\delta x_t\|] \quad \text{(no-switch)}$$

Following the intuition gained earlier, the filtering distribution is estimated as, $$\hat{p}(z_t = z, x_{1:t}) = p(x_t \mid z_t = z)p(x_{1:t-1}) \qquad (6)$$

$$\left[\sum_i^C (\sigma_{t-1,i}(1-z_i)O(t, i) + (1-\sigma_{t-1,i})z_i I(t, i)) + \right.$$

$$\left. \prod_i^C (z_i \sigma_{t-1,i} + (1-z_i)(1-\sigma_{t-1,i}))X(t) \right]$$

The model described in equation (6) models dependencies between components to some degree. The product in the last line can be expanded into all combinations of component configurations where no component switches from t−1 to t. This factorization allows for a compact and differentiable representation of 'no component' switches without having to enumerate an exponential number of configurations, therefore modeling limited dependencies between components efficiently.

Resulting Algorithm: Variational BOLT

The resulting algorithm, which is called Variational BOLT, operates in temporal mini batches of a fixed time-horizon h, i.e. the data is sequentially fed into the neural network and model parameters $\Theta$ and W are updated before a new mini batch of data is processed. This process is repeated until convergence. Algorithm 1 explains the process in pseudo-code.

The resulting algorithm has similarities to Variational Autoencoders (VAE) as well as Expectation Maximization, specifically the Baum-Welch algorithm. Like VAE, an efficient auxiliary recognition distribution is trained to predict the parameters of the latent distribution. However, the auxiliary distribution is solely used to speed up computations of the filtering recursion. Unlike VAE and like EM, instead of approximating intractable expectations by sampling latent states from the recognition distribution, updates are computed based on a fixed set of possible hidden states.

Experiments

The dataset contains current and voltage readings at the main distribution panel with a sampling rate of 16 kHz and breaker level power readings with a sampling frequency of 0.3 Hz. The neural network used to predict $q(z_t=1|1x_{1:t})$ is a 4-layer recurrent neural network. The bottom two layers constitute non-recurrent tan h layers with 200 output units each. The top two layers are LSTM-layers with sigmoid-activations each with 100 and 10 output units respectively. This means that 10 components were extracted and maximally 6 out of these 10 inferred components were allowed to be active at any given time ($\epsilon=6$).

Figure 5:
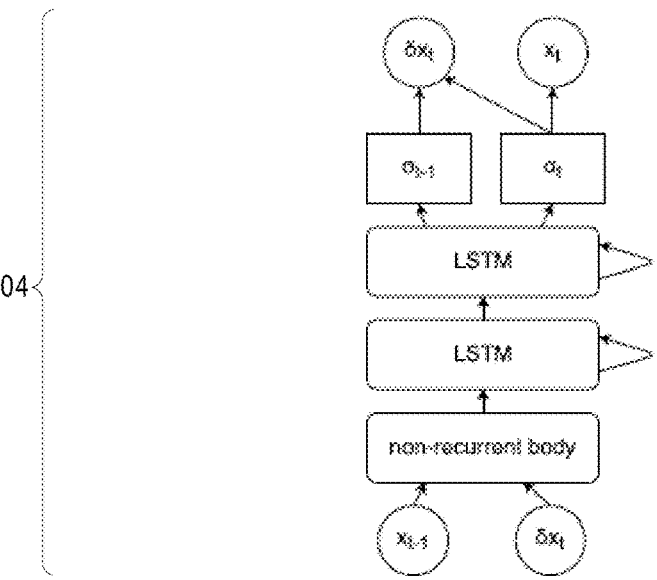
FIG. 5 shows example pseudocode for energy desegregation.

FIG. 5 shows an example machine learning model 500. Pseudocode 502 shows an example of the implementation of the neural network on the meter 200. A graphical depiction 504 shows different nodes of the neural network.

Change points of the aggregate power were detected by an event detection algorithm: Let p(t) be the aggregate power at time t. The maximum value of the absolute difference in the power signal within a window of 5 time steps was extracted. Every window then casts a vote for the highest absolute power difference. However, only these timestamps for which |p(t)−p(t−1)|>50 W holds can receive a vote. Every time stamp that received more than 3 votes is considered an event. Then, in order to reduce the number of decision variables, the mean instantaneous power waveforms in between events was extracted, and these constitute the set of T values of xt.

The neural network was then fed $x_t$ and $\delta x_t = x_t - x_t - 1$ and tasked to explain $x_{t+1}$ and δxt. In order to speed up convergence, the appliance waveforms W were initialized by the cluster centroids obtained by applying K-Means to the difference signal δxt. In the experiments the hyper-parameters α and β, i.e. the variance of the difference and aggregate model were kept at 1. The model was trained for 200 iterations. For inference, the filtering distribution probabilities were simply binarized: z=σ>0.5.

Results

Figure 6:
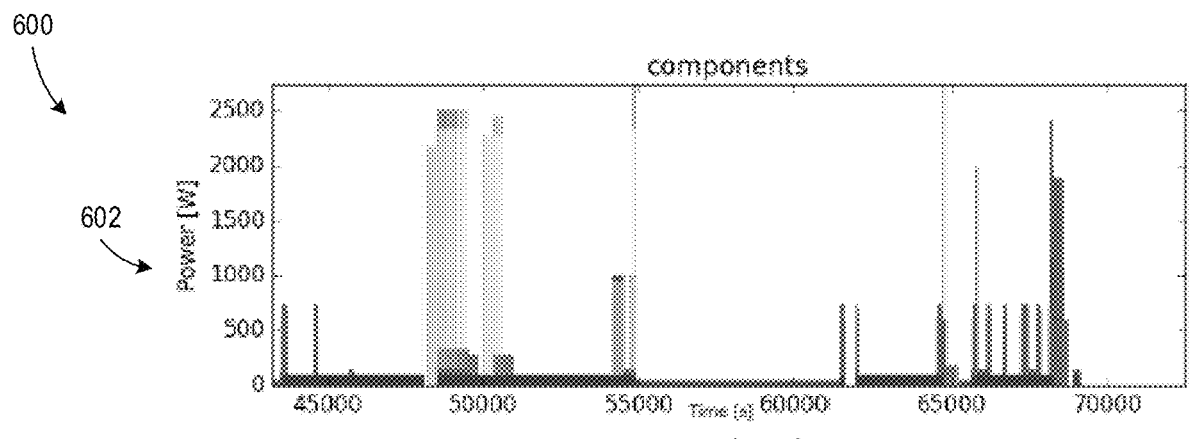
FIG. 6 shows examples of estimated power consumption by remote devices.
Figure 6:
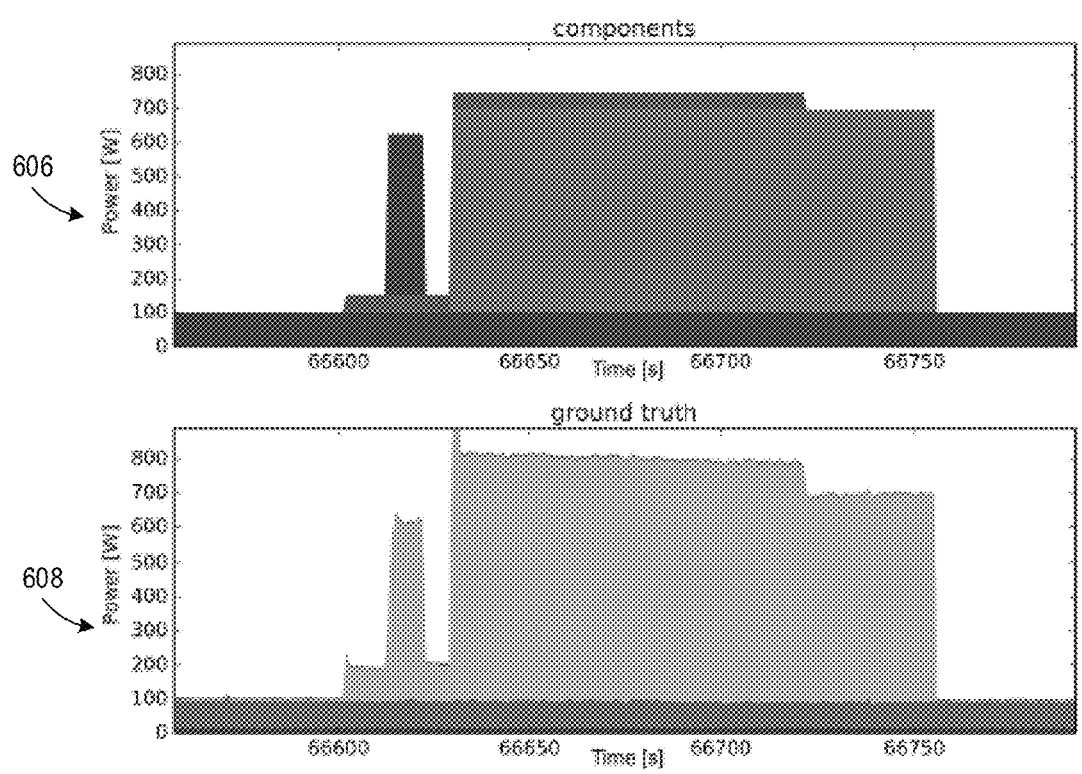

Since appliances were sub-metered at the circuit level and some circuits contain multiple appliances, precision and recall are used as a metric. Recall measures what portion of a given circuits energy is correctly classified, while precision measures, of the energy assigned to a circuit, how much truly belonged to that circuit. For every pair of inferred component and circuit, precision and recall were computed and the component resulting in the highest (prec+recall)/2 was selected for this circuit. Note that because z is binary, appliances are two-state, i.e. they can be either on or off. FIG. 6 shows results data 600 including example inferred components 602 of a power system and circuit level ground truth 604 of the power system. However, appliances like e.g. a furnace are composed of multiple sub-elements. In that case, the proposed model 'over-disaggregates', i.e. it assigns a component for every sub-element. An example of 'over-disaggregation' can be seen in FIG. 6 at 606 and 608. In this way, additional operational states of the remote devices can be detected. Furthermore, some appliances have different power levels according to their operational state, i.e. a hair dryer has different heat settings. In this case, the proposed methods assigns different components for the same appliances.

Table 1 shows a comparison with AFAMAP.

| (a) Circuit | AFAMAP (supervised*) | VarBOLT (unsupervised) |
|---|---|---|
| Microwave | 97.5%/66.1% | 88.8%/8.0% |
| Bath GFI | 82.7%/70.8% | 71.9%/40.2% |
| Electronics | 41.6%/0.8% | 87.8%/40.7% |
| Kitch. Out. 1 | 37.5%/12.9% | 8.6%/32.8% |
| Furnace | 91.7%/70.8% | 85.0%/50.6% |
| Kitch. Out. 2 | 45.2%/16.0% | 5.3%/70.1% |
| Washer/Dryer | 98.8%/73.6% | 97.3%/72.3% |

| (b) | NFHMM (unsupervised) | VarBOLT (unsupervised) |
|---|---|---|
| Overall panel | 0.25 | 0.63 |

AFAMAP is a supervised inference algorithm paired with an unsupervised strategy of obtaining model parameters for the individual HMM chains.

Figure 7:
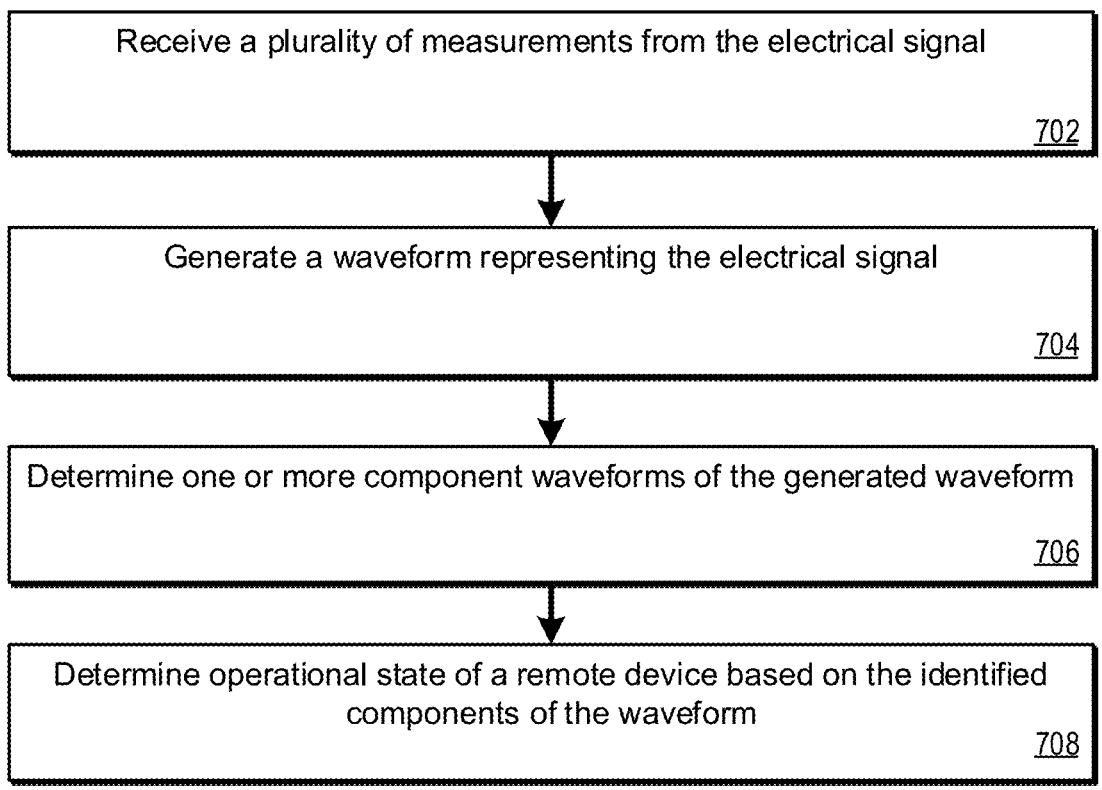
FIG. 7 shows an example process for energy desegregation.

FIG. 7 shows an example process for energy desegregation. The meter receives (702), from the one or more sensors, a plurality of measurements of the electrical signal. The meter generates (704), from the plurality of measurements, a waveform representing the electrical signal. The meter determines (706) one or more component waveforms that form the waveform. In some implementations, the determination is made by inputting the waveform into one or more entries of a data structure, each entry of the one or more entries of the data structure storing a weight value that is determined based at least in part on values of the data signatures representing the plurality of remote devices, each entry being connected to one or more other entries of the data structure. For each of the one or more entries, the meter generates an output value by performing an arithmetic operation on the waveform stored at that entry, the arithmetic operation comprising a function of the weight value. The meter identifies, from among the data signatures, based on the output values for each of the one or more entries, one or more particular data signatures that are represented in the waveform. The meter determines (708), based on the particular data signatures, an operational state of one or more remote devices of the plurality of remote devices.

Figure 8:
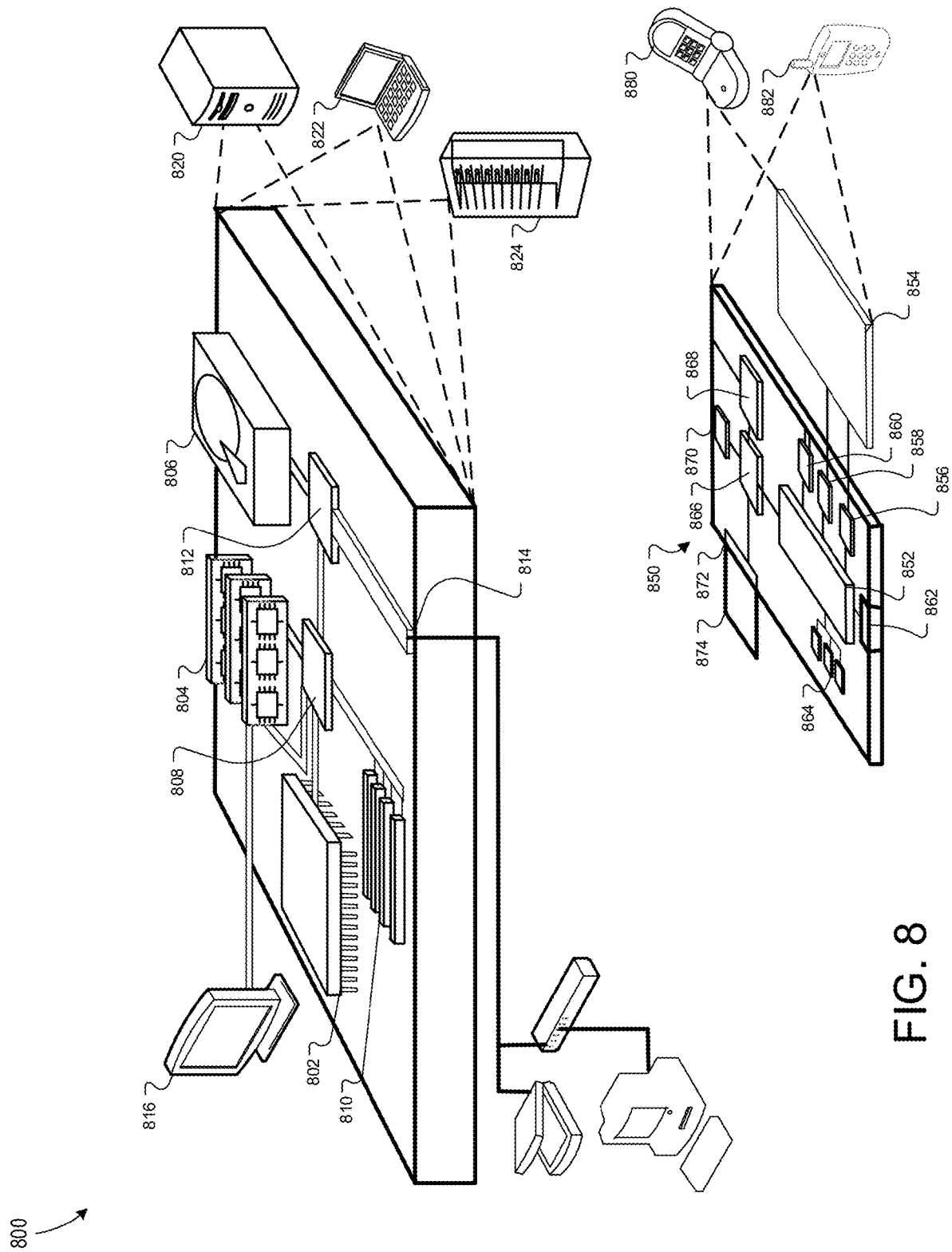
FIG. 8 shows an example computing system.

FIG. 8 shows example computing devices 800, 850 that may be used to implement the energy meter system 100, as either a client or as a server or plurality of servers. Computing device 800 is intended to represent various forms of digital computers, such as laptops, desktops, workstations, personal digital assistants, servers, blade servers, mainframes, and other appropriate computers. Computing device 850 is intended to represent various forms of mobile devices, such as personal digital assistants, cellular telephones, smartphones, and other similar computing devices. Additionally, computing device 800 or 850 can include Universal Serial Bus (USB) flash drives. The USB flash drives may store operating systems and other applications. The USB flash drives can include input/output components, such as a wireless transmitter or USB connector that may be inserted into a USB port of another computing device. The components shown here, their connections and relationships, and their functions, are meant to be exemplary only, and are not meant to limit implementations of the inventions described and/or claimed in this document.

Computing device 800 includes a processor 802, memory 804, a storage device 806, a high-speed interface 808 connecting to memory 804 and high-speed expansion ports 810, and a low speed interface 812 connecting to low speed bus 814 and storage device 806. Each of the components 802, 804, 806, 808, 810, and 812, are interconnected using various busses, and may be mounted on a common motherboard or in other manners as appropriate. The processor 802 can process instructions for execution within the computing device 800, including instructions stored in the memory 804 or on the storage device 806 to display graphical information for a GUI on an external input/output device, such as display 816 coupled to high speed interface 808. In other implementations, multiple processors and/or multiple buses may be used, as appropriate, along with multiple memories and types of memory. Also, multiple computing devices 800 may be connected, with each device providing portions of the necessary operations (e.g., as a server bank, a group of blade servers, or a multi-processor system).

The memory 804 stores information within the computing device 800. In one implementation, the memory 804 is a volatile memory unit or units. In another implementation, the memory 804 is a non-volatile memory unit or units. The memory 804 may also be another form of computer-readable medium, such as a magnetic or optical disk.

The storage device 806 is capable of providing mass storage for the computing device 800. In one implementation, the storage device 806 may be or contain a computer-readable medium, such as a floppy disk device, a hard disk device, an optical disk device, or a tape device, a flash memory or other similar solid state memory device, or an array of devices, including devices in a storage area network or other configurations. A computer program product can be tangibly embodied in an information carrier. The computer program product may also contain instructions that, when executed, perform one or more methods, such as those described above. The information carrier is a computer- or machine-readable medium, such as the memory 804, the storage device 806, or memory on processor 802.

The high speed controller 808 manages bandwidth-intensive operations for the computing device 800, while the low speed controller 812 manages lower bandwidth-intensive operations. Such allocation of functions is exemplary only. In one implementation, the high-speed controller 808 is coupled to memory 804, display 816 (e.g., through a graphics processor or accelerator), and to high-speed expansion ports 810, which may accept various expansion cards (not shown). In the implementation, low-speed controller 812 is coupled to storage device 806 and low-speed expansion port 814. The low-speed expansion port, which may include various communication ports (e.g., USB, Bluetooth, Ethernet, wireless Ethernet) may be coupled to one or more input/output devices, such as a keyboard, a pointing device, a scanner, or a networking device such as a switch or router, e.g., through a network adapter.

The computing device 800 may be implemented in a number of different forms, as shown in the figure. For example, it may be implemented as a standard server 820, or multiple times in a group of such servers. It may also be implemented as part of a rack server system 824. In addition, it may be implemented in a personal computer such as a laptop computer 822. Alternatively, components from computing device 800 may be combined with other components in a mobile device (not shown), such as device 850. Each of such devices may contain one or more of computing device 800, 850, and an entire system may be made up of multiple computing devices 800, 850 communicating with each other.

Computing device 850 includes a processor 852, memory 864, an input/output device such as a display 854, a communication interface 866, and a transceiver 868, among other components. The device 850 may also be provided with a storage device, such as a microdrive or other device, to provide additional storage. Each of the components 850, 852, 864, 854, 866, and 868, are interconnected using various buses, and several of the components may be mounted on a common motherboard or in other manners as appropriate.

The processor 852 can execute instructions within the computing device 850, including instructions stored in the memory 864. The processor may be implemented as a chipset of chips that include separate and multiple analog and digital processors. Additionally, the processor may be implemented using any of a number of architectures. For example, the processor 410 may be a CISC (Complex Instruction Set Computers) processor, a RISC (Reduced Instruction Set Computer) processor, or a MISC (Minimal Instruction Set Computer) processor. The processor may provide, for example, for coordination of the other components of the device 850, such as control of user interfaces, applications run by device 850, and wireless communication by device 850.

Processor 852 may communicate with a user through control interface 858 and display interface 856 coupled to a display 854. The display 854 may be, for example, a TFT (Thin-Film-Transistor Liquid Crystal Display) display or an OLED (Organic Light Emitting Diode) display, or other appropriate display technology. The display interface 856 may comprise appropriate circuitry for driving the display 854 to present graphical and other information to a user. The control interface 858 may receive commands from a user and convert them for submission to the processor 852. In addition, an external interface 862 may be in communication with processor 852, so as to enable near area communication of device 850 with other devices. External interface 862 may provide, for example, for wired communication, or for wireless communication in other implementations, and multiple interfaces may also be used.

The memory 864 stores information within the computing device 850. The memory 864 can be implemented as one or more of a computer-readable medium or media, a volatile memory unit or units, or a non-volatile memory unit or units. Expansion memory 874 may also be provided and connected to device 850 through expansion interface 872, which may include, for example, a SIMM (Single In-Line Memory Module) card interface. Such expansion memory 874 may provide extra storage space for device 850, or may also store applications or other information for device 850. Specifically, expansion memory 874 may include instructions to carry out or supplement the processes described above, and may include secure information also. Thus, for example, expansion memory 874 may be a security module for device 850, and may be programmed with instructions that permit secure use of device 850. In addition, secure applications may be provided via the SIMM cards, along with additional information, such as placing identifying information on the SIMM card in a non-hackable manner.

The memory may include, for example, flash memory and/or NVRAM memory, as discussed below. In one implementation, a computer program product is tangibly embodied in an information carrier. The computer program product contains instructions that, when executed, perform one or more methods, such as those described above. The information carrier is a computer- or machine-readable medium, such as the memory 864, expansion memory 874, or memory on processor 852 that may be received, for example, over transceiver 868 or external interface 862.

Device 850 may communicate wirelessly through communication interface 866, which may include digital signal processing circuitry where necessary. Communication interface 866 may provide for communications under various modes or protocols, such as GSM voice calls, SMS, EMS, or MMS messaging, CDMA, TDMA, PDC, WCDMA, CDMA2000, or GPRS, among others. Such communication may occur, for example, through radio-frequency transceiver 868. In addition, short-range communication may occur, such as using a Bluetooth, WiFi, or other such transceiver (not shown). In addition, GPS (Global Positioning System) receiver module 870 may provide additional navigation- and location-related wireless data to device 850, which may be used as appropriate by applications running on device 850.

Device 850 may also communicate audibly using audio codec 860, which may receive spoken information from a user and convert it to usable digital information. Audio codec 860 may likewise generate audible sound for a user, such as through a speaker, e.g., in a handset of device 850. Such sound may include sound from voice telephone calls, may include recorded sound (e.g., voice messages, music files, etc.) and may also include sound generated by applications operating on device 850.

The computing device 850 may be implemented in a number of different forms, as shown in the figure. For example, it may be implemented as a cellular telephone 880. It may also be implemented as part of a smartphone 882, personal digital assistant, or other similar mobile device.

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms "machine-readable medium" "computer-readable medium" refers to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

To provide for interaction with a user, the systems and techniques described here can be implemented on a computer having a display device (e.g., a CRT (cathode ray tube) or LCD (liquid crystal display) monitor) for displaying information to the user and a keyboard and a pointing device (e.g., a mouse or a trackball) by which the user can provide input to the computer. Other kinds of devices can be used to provide for interaction with a user as well; for example, feedback provided to the user can be any form of sensory feedback (e.g., visual feedback, auditory feedback, or tactile feedback); and input from the user can be received in any form, including acoustic, speech, or tactile input.

The systems and techniques described here can be implemented in a computing system that includes a back-end component (e.g., as a data server), or that includes a middleware component (e.g., an application server), or that includes a front-end component (e.g., a client computer having a graphical user interface or a Web browser through which a user can interact with an implementation of the systems and techniques described here), or any combination of such back-end, middleware, or front-end components. The components of the system can be interconnected by any form or medium of digital data communication (e.g., a communication network). Examples of communication networks include a local area network ("LAN"), a wide area network ("WAN"), peer-to-peer networks (having ad-hoc or static members), grid computing infrastructures, and the Internet.

The computing system can include clients and servers. A client and server are generally remote from each other and typically interact through a communication network. The relationship of client and server arises by virtue of computer programs running on the respective computers and having a client-server relationship to each other.

Although a few implementations have been described in detail above, other modifications are possible. Moreover, other mechanisms for content delivery acceleration may be used. In addition, the logic flows depicted in the figures do not require the particular order shown, or sequential order, to achieve desirable results. Other steps may be provided, or steps may be eliminated, from the described flows, and other components may be added to, or removed from, the described systems. Accordingly, other implementations are within the scope of the following claims.

What is claimed is:

1. A meter comprising:
   one or more sensors configured to measure an electrical signal;
   one or more hardware storage devices configured to store data signatures representing a plurality of remote devices, wherein each data signature represents at least a portion of a remote device of the plurality of remote devices;
   an executable logic engine configured to perform operations comprising:
   receiving, from the one or more sensors, a plurality of measurements of the electrical signal;
   generating, from the plurality of measurements, a waveform representing energy of the electrical signal;
   determining one or more component waveforms that form the waveform by:
   inputting the waveform into one or more nodes of a neural network, each node of the one or more nodes of the neural network storing a weight value that is determined based at least in part on training data comprising values of the data signatures that are each associated with at least one of the plurality of remote devices, each node being connected to one or more other nodes of the neural network;
   for each of the one or more nodes, generating an output value by performing an arithmetic operation on the waveform stored at that node, the arithmetic operation comprising a function of the weight value; and
   identifying from among the data signatures, based on the output values for each of the one or more nodes, one or more particular data signatures that are represented in the waveform;
   associating, based on the output values for each of the one or more nodes, each of the one or more particular data signatures with a respective remote device of the plurality of remote devices to disaggregate the waveform representing the energy of the electrical signal into the one or more particular data signatures each representing that respective remote device; and
   determining, based on the particular data signatures, that at least one remote device of the plurality of remote devices is malfunctioning;
   a controller configured to perform operations comprising:
   selecting, in response to determining that the at least one of the one or more remote devices is malfunctioning, the at least one device;
   generating a control signal to change an operational state of the selected device; and
   controlling, by the control signal, the operation of the selected device to change the operational state of the selected device.

2. The meter of claim 1, wherein the weight value of an entry of the neural network is determined based on an unsupervised machine learning process.

3. The meter of claim 2, wherein the executable logic engine is further configured to adjust a weight value of one or more data entries based on receiving data representing additional remote devices, and wherein determining the one or more component waveforms that form the waveform is based on the adjusted weight value of the one or more data entries.

4. The meter of claim 1, wherein the executable logic engine is further configured to adjust a weight value of one or more data entries based on additional data representing one or more of a time of day, a temperature, a number of remote devices contributing to the electrical signal, building automation system signals, input from a user, and a constraint value of the waveform.

5. The meter of claim 1, wherein the executable logic engine comprises a neural network.

6. The meter of claim 1, wherein the waveform is generated based on measurements received during an integer number of periods of an alternating-current (AC) cycle.

7. The meter of claim 1, wherein a remote device of the plurality of remote devices comprises one of an appliance or a portion of an appliance.

8. The meter of claim 1, wherein the plurality of measurements comprises a current measurement.

9. The meter of claim 1, wherein the plurality of measurements comprises voltage measurements at one or more sequential, individual cycles of an alternative current (AC) signal.

10. The meter of claim 1, wherein the plurality of measurements comprises a measurement of instantaneous power.

11. The meter of claim 1, further comprising a controller configured to control operation of one or more remote devices of the plurality of remote devices in response to determining the operational state of the one or more remote devices.

12. The meter of claim 1, the neural network is configured to reduce a computation time of determining the one or more component waveforms by reducing a number of calculations to determine the one or more component waveforms relative to determining the one or more component waveforms without the neural network.

13. The meter of claim 1, the operations further comprising:
  determining, for each of one or more alternative current (AC) voltage cycles represented in the plurality of measurements of the electrical signal, a temporal activation pattern associated with each of the one or more remote devices; and
  modeling a temporal dependency between or among the one or more remote devices based on the temporal activation pattern associated with each of the one or more remote devices.

14. A system comprising:
  a server configured to store a library of data signatures, wherein each data signature of the library of data signatures represents at least a portion of a remote device of a plurality of remote devices; and
  one or more meters in communication with the server, each meter comprising:
    one or more sensors configured to measure an electrical signal;
    one or more processors configured to determine an operational state of the remote device by performing operations comprising:
      receiving, from the one or more sensors, a plurality of measurements of the electrical signal;
      generating, from the plurality of measurements, a waveform representing energy of the electrical signal;
      determining one or more component waveforms that form the waveform by:
        inputting the waveform into one or more nodes of a neural network, each node of the one or more nodes of the neural network storing a weight value that is determined based at least in part on training data comprising values of the data signatures that are each associated with at least one of the plurality of remote devices, each node being connected to one or more other nodes of the neural network;
        for each of the one or more nodes, generating an output value by performing an arithmetic operation on the waveform stored at that node, the arithmetic operation comprising a function of the weight value; and
        identifying from among the data signatures, based on the output values for each of the one or more nodes, one or more particular data signatures that are represented in the waveforms;
      associating, based on the output values for each of the one or more nodes, each of the one or more particular data signatures with a respective remote device of the plurality of remote devices to disaggregate the waveform representing the energy of the electrical signal into the one or more particular data signatures each representing that respective remote device; and
      determining, based on the particular data signatures, that at least
      one remote device of the plurality of remote devices is malfunctioning;
    a controller configured to perform operations comprising:
      selecting, in response to determining that the at least one of the one or more remote devices is malfunctioning, the at least one device;
      generating a control signal to change an operational state of the selected device; and
      controlling, by the control signal, the operation of the selected device to change the operational state of the selected device.

15. The system of claim 14, wherein the server is further configured to:
  store calibration data;
  send the calibration data to a meter; and
  cause the meter to adjust one or more weight values of the data structure based on the calibration data.

16. The system of claim 15, wherein the server is further configured to send the calibration data to the meter in response to receiving a signal from the meter indicating a failure of the one or more processors to determine the operational state of the one or more remote devices of the plurality of remote devices.

17. The system of claim 14, wherein the server is further configured cause a meter to update a library of data signatures stored by the meter, wherein the update is caused by the server in response to receiving a signal from the meter indicating a failure of the one or more processors to determine the operational state of the one or more remote devices of the plurality of remote devices.

18. A non-transitory computer readable medium storing instructions that are executable by one or more processors configured to perform operations comprising:

receiving data signatures representing a plurality of remote devices, wherein each data signature represents at least a portion of a remote device of the plurality of remote devices;

receiving a plurality of measurements of an electrical signal;

generating, from the plurality of measurements, a waveform representing energy of the electrical signal;

determining one or more component waveforms that form the waveform by:

inputting the waveform into one or more nodes of a neural network, each node of the one or more nodes of the neural network storing a weight value that is determined based at least in part on training data comprising values of the data signatures that are each associated with at least one of the plurality of remote devices, each node being connected to one or more other nodes of the neural network;

for each of the one or more nodes, generating an output value by performing an arithmetic operation on the waveform stored at that node, the arithmetic operation comprising a function of the weight value; and identifying from among the data signatures, based on the output values for each of the one or more nodes, one or more particular data signatures that are represented in the waveform;

associating, based on the output values for each of the one or more nodes, each of the one or more particular data signatures with a respective remote device of the plurality of remote devices to disaggregate the waveform representing the energy of the electrical signal into the one or more particular data signatures each representing that respective remote device; and determining, based on the particular data signatures, that at least one remote device of the plurality of remote devices is malfunctioning;

selecting, in response to determining that the at least one of the one or more remote devices is malfunctioning, the at least one device;

generating a control signal to change an operational state of the selected device; and controlling, by the control signal, the operation of the selected device to change the operational state of the selected device.

19. The non-transitory computer readable medium of claim 18, wherein the neural network is configured to reduce a computation time of determining the one or more component waveforms by reducing a number of calculations to determine the one or more component waveforms relative to determining the one or more component waveforms without the neural network.

* * * * *

UNITED STATES PATENT AND TRADEMARK OFFICE
CERTIFICATE OF CORRECTION

| | |
|---|---|
| PATENT NO. | : 11,499,999 B2 |
| APPLICATION NO. | : 15/976774 |
| DATED | : November 15, 2022 |
| INVENTOR(S) | : Henning Lange, Jeremy Zico Kolter and Mario Berges |

It is certified that error appears in the above-identified patent and that said Letters Patent is hereby corrected as shown below:

In the Claims

Column 24, Line 28, Claim 14, delete "waveforms;" and insert -- waveform; --

Signed and Sealed this
Fourth Day of April, 2023

Katherine Kelly Vidal
*Director of the United States Patent and Trademark Office*